US012690365B2

(12) United States Patent
Hu

(10) Patent No.: US 12,690,365 B2
(45) Date of Patent: Jul. 21, 2026

(54) DISPLAY PANELS AND DISPLAY APPARATUSES

(71) Applicant: Shenzhen China Star Optoelectronics Semiconductor Display Technology Co., Ltd., Shenzhen (CN)

(72) Inventor: Jingyuan Hu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 438 days.

(21) Appl. No.: 18/482,884

(22) Filed: Oct. 8, 2023

(65) Prior Publication Data

US 2025/0072262 A1 Feb. 27, 2025

(30) Foreign Application Priority Data

Aug. 24, 2023 (CN) .......................... 202311071183.1

(51) Int. Cl.
*H10K 59/80* (2023.01)
*H10K 59/131* (2023.01)
(52) U.S. Cl.
CPC ..... *H10K 59/80522* (2023.02); *H10K 59/131* (2023.02)
(58) Field of Classification Search
CPC .......... H10K 59/80522; H10K 59/131; H10K 59/122; H10K 59/1315; H10K 59/80521
See application file for complete search history.

(56) References Cited

U.S. PATENT DOCUMENTS 8,957,413 B2 * 2/2015 Song ................ H10K 59/80522
257/89

FOREIGN PATENT DOCUMENTS

CN 110911461 A 3/2020
CN 112103326 A 12/2020
(Continued)

OTHER PUBLICATIONS

Chinese Office Action issued in corresponding Chinese Patent Application No. 202311071183.1 dated Sep. 22, 2023, pp. 1-7.
(Continued)

*Primary Examiner* — Tan N Tran
(74) *Attorney, Agent, or Firm* — PV IP PC; Peter Stecher; Wei Te Chung

(57) ABSTRACT

The present disclosure provides a display panel and a display apparatus. The display panel includes a cathode unit area provided with a pixel area; the display panel further includes a thin film transistor layer, a first conductive layer, a light-emitting functional layer, and a cathode layer; the thin film transistor layer includes an auxiliary cathode wiring; the first conductive layer includes a connection electrode disposed surrounding the cathode unit area and connected to the auxiliary cathode wiring, and a side wall of the connection electrode is in a concave shape to form an undercut opening disposed surrounding the cathode unit area; the light-emitting functional layer and the cathode layer are partitioned at the undercut opening; and the cathode layer includes a first cathode disposed within the cathode unit area, the connection electrode is disposed surrounding the first cathode and connected to the first cathode.

20 Claims, 6 Drawing Sheets

(56) References Cited

FOREIGN PATENT DOCUMENTS

| CN | 112310306 A | 2/2021 |
| CN | 113097408 A | 7/2021 |
| CN | 114141826 A | 3/2022 |
| CN | 114171566 A | 3/2022 |
| CN | 114695498 A | 7/2022 |
| CN | 115220600 A | 10/2022 |
| CN | 115275041 A | 11/2022 |
| CN | 115275046 A | 11/2022 |
| CN | 115942774 A | 4/2023 |

OTHER PUBLICATIONS

Chinese Office Action issued in corresponding Chinese Patent Application No. 202311071183.1 dated Oct. 16, 2023, pp. 1-8.

* cited by examiner

DISPLAY PANELS AND DISPLAY APPARATUSES

CROSS-REFERENCE TO RELATED APPLICATION

This application claims priority to and benefit of Chinese Patent Application No. 202311071183.1, filed on Aug. 24, 2023, the disclosure of which is incorporated herein by reference in its entirety.

TECHNICAL FIELD

The present disclosure relates to the field of display technology, and in particular, to display panels and display apparatuses.

BACKGROUND

An organic light-emitting diode (OLED) display panel is widely recognized as the most promising display panel in the industry due to its advantages of self-illumination, low driving voltage, high luminous efficiency, short response time, high resolution and contrast, nearly 180° of viewing angle, a wide temperature range for use, the ability to realize flexible display and full-color display in a large area, and the like.

With the rapid development of the OLED display panel, the demand for a large-sized OLED display panel is increasing. However, in an operation state of the large-sized OLED display panel (especially the top emission display panel), the voltage drop generates in the display center area, the area outside the display center area, and surrounding edges of the OLED display panel, resulting in uneven display of the OLED display panel.

SUMMARY

Embodiments of the present disclosure provide a display panel that includes a cathode unit area, and a spacing area disposed outside the cathode unit area and adjacent to the cathode unit area, in which the cathode unit area is provided with at least one pixel area;

the display panel further includes:

a thin film transistor layer including an auxiliary cathode wiring;

a first conductive layer disposed on the thin film transistor layer, in which the first conductive layer includes a connection electrode disposed surrounding the cathode unit area and connected to the auxiliary cathode wiring; a side wall of the connection electrode is in a concave shape to form an undercut opening disposed surrounding the cathode unit area;

a light-emitting functional layer disposed on a side of the first conductive layer away from the thin film transistor layer and partitioned at the undercut opening; and a cathode layer disposed on a side of the light-emitting functional layer away from the thin film transistor layer and partitioned at the undercut opening;

in which the cathode layer includes a first cathode disposed within the cathode unit area, and the connection electrode is disposed surrounding the first cathode and connected to the first cathode.

Embodiments of the present disclosure further provide a display apparatus that includes the above-mentioned display panel.

BRIEF DESCRIPTION OF THE DRAWINGS

The following is a detailed description of specific implementation methods of the present disclosure, in combination with the accompanying drawings, which will render technical solutions and other beneficial effects of the present disclosure obvious.

DETAILED DESCRIPTION

The following will provide a clear and complete description of technical solutions in embodiments of the present disclosure in conjunction with the accompanying drawings. Apparently, the described embodiments are only a part of the embodiments of the present disclosure, not all of them. Based on the embodiments in the present disclosure, all other embodiments obtained by those skilled in the art without creative labor fall within the scope of protection in the present disclosure.

The following disclosure provides many different embodiments or examples to implement different structures of the present disclosure. In order to simplify the disclosure of the present disclosure, specific embodiments of components and settings will be described below. Of course, they are only examples and are not intended to limit the present disclosure. Moreover, the present disclosure may repeat reference numbers and/or reference letters in different embodiments for the purpose of simplification and clarity, and does not itself indicate the relationship between the various embodiments and/or settings discussed. Further, the present disclosure provides examples of various specific processes and materials, but ordinary skilled in the art may be aware of the application of other processes and/or the use of other materials.

Figure 1:
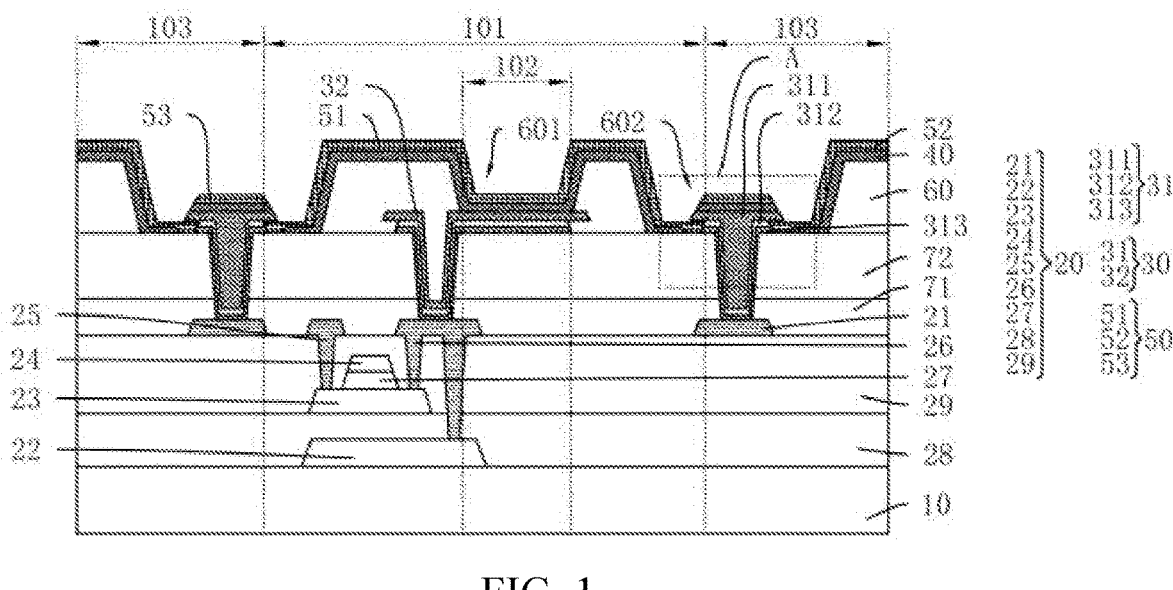
FIG. 1 is a schematic cross-sectional structural diagram of a display panel according to some embodiments of the present disclosure.
Figure 2:
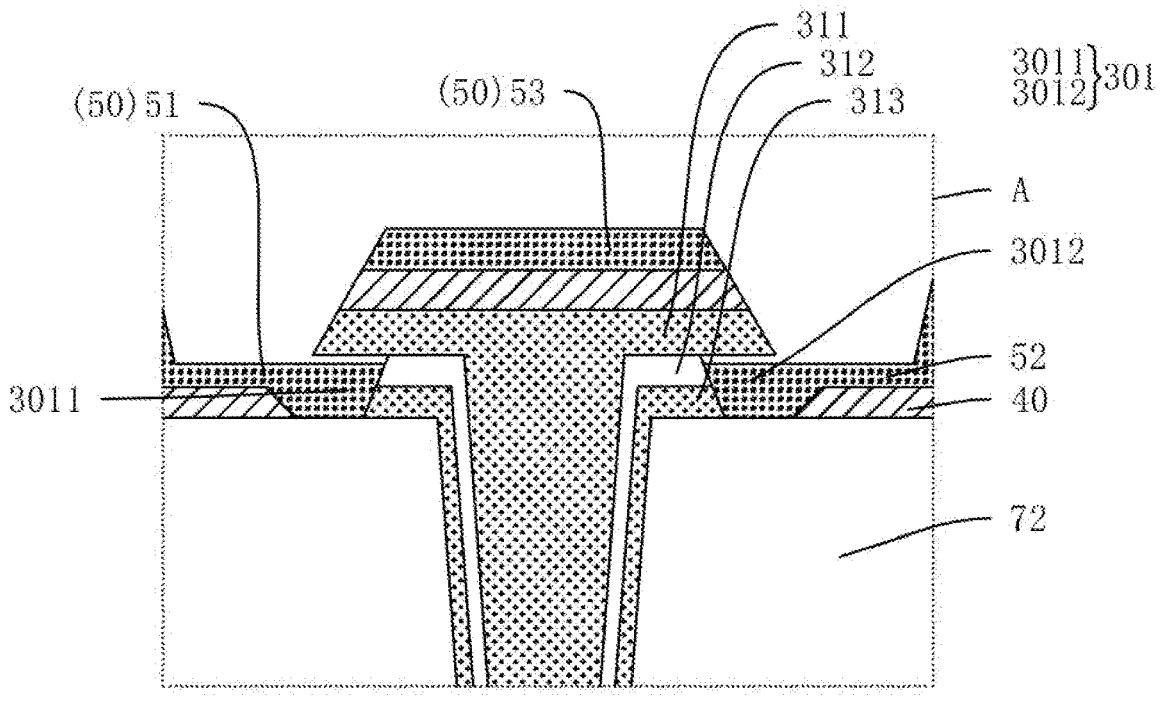
FIG. 2 is a schematic enlarged structural diagram corresponding to a position A in FIG. 1 according to some embodiments of the present disclosure.
Figure 3:
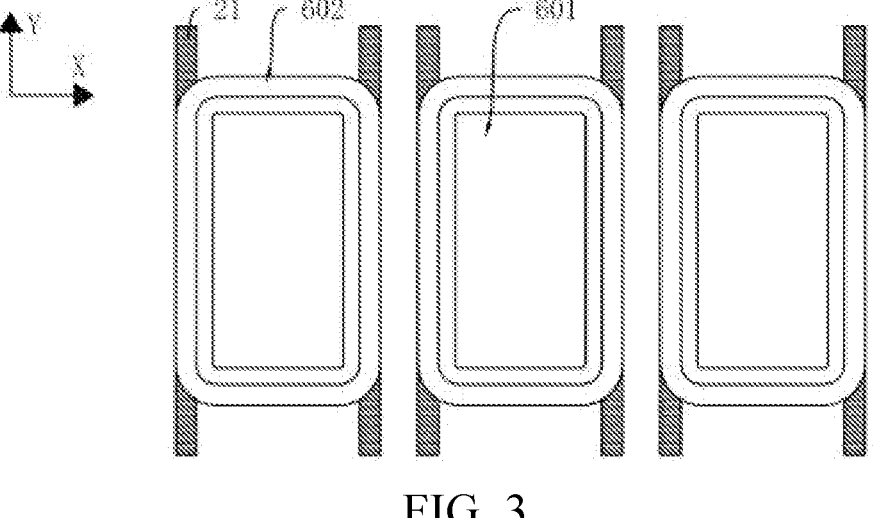
FIG. 3 is a schematic planar structural diagram of a display panel according to some embodiments of the present disclosure.

Referring to FIG. 1, FIG. 2, and FIG. 3, embodiments of the present disclosure provide a display panel that includes a cathode unit area 101, spacing areas 103 disposed outside the cathode unit area 101 and adjacent to the cathode unit area 101. The cathode unit area 101 is provided with at least one pixel area 102.

The display panel further includes a thin film transistor layer 20, a first conductive layer 30, a light-emitting functional layer 40, and a cathode layer 50.

The thin film transistor layer 20 includes an auxiliary cathode wiring 21. The first conductive layer 30 is disposed on the thin film transistor layer 20 and includes a connection electrode 31. The connection electrode 31 is disposed surrounding the cathode unit area 101 and connected to the auxiliary cathode wiring 21. A side wall of the connection electrode 31 is in a concave shape to form an undercutting opening 301 disposed surrounding the cathode unit area 101. The light-emitting functional layer 40 is disposed on a side of the first conductive layer 30 away from the thin film transistor layer 20 and partitioned at the undercutting opening 301. The cathode layer 50 is disposed on a side of the light-emitting functional layer 40 away from the thin film transistor layer 20 and partitioned at the undercutting opening 301.

Further, the cathode layer 50 includes a first cathode 51 disposed within the cathode unit area 101, and the connection electrode 31 is disposed surrounding the first cathode 51 and connected to the first cathode 51.

Embodiments of the present disclosure, by disposing the connection electrode 31 and the cathode unit area 101, separate the first cathode 51 from the cathode layer 50, realize the signal transmission of the auxiliary cathode wiring 21 to the first cathode 51, effectively improve the voltage drop phenomenon of the cathode layer 50, and improve display uniformity of the display panel. Moreover, by disposing the connection electrode 31 surrounding the first cathode 51, and separating the first cathode 51 from other parts of the cathode layer 50, the embodiments of the present disclosure realize the function of independent signal transmission of the auxiliary cathode wiring 21 to the first cathode 51, so that suitable voltage can be loaded on the first cathode 51 according to actual demands, which further improves the display uniformity of the display panel.

Specifically, please continue to combine FIG. 1, FIG. 2, FIG. 3, and FIG. 4, in an embodiment of the present disclosure, the display panel further includes a substrate 10, an interlayer insulation layer 71, a planarization layer 72, and a pixel definition layer 60.

The thin film transistor layer 20 is disposed on the substrate 10. The interlayer insulation layer 71 is disposed on the thin film transistor layer 20. The planarization layer 72 is disposed on the interlayer insulation layer 71. The first conductive layer 30 is disposed on the planarization layer 72. The pixel definition layer 60 is disposed between the first conductive layer 30 and the light-emitting functional layer 40. The cathode layer 50 is disposed on a side of the light-emitting functional layer 40 away from the pixel definition layer 60.

Further, the thin film transistor layer 20 is disposed on the substrate 10 and includes a thin film transistor, a light-shielding layer 22, and an insulation layer covering the thin film transistor. Specifically, the thin film transistor includes an active layer 23, a gate electrode 24, a source electrode 25, and a drain electrode 26. The insulation layer includes a first insulation layer 28, a second insulation layer 29, and a gate insulation layer 27 that are sequentially disposed between the substrate 10 and the interlayer insulation layer 71.

The light-shielding layer 22 is disposed on the substrate 10 and covered by the first insulation layer 28. The active layer 23 is disposed on the first insulation layer 28 and covered by the second insulation layer 29, and the active layer 23 is disposed on a side of the light-shielding layer 22 away from the substrate 10. The gate insulation layer 27 is disposed on a side of the active layer 23 away from the light-shielding layer 22. The gate electrode 24 is disposed on a side of the gate insulation layer 27 away from the active layer 23. The second insulation layer 29 covers the active layer 23, the gate insulation layer 27, and the gate electrode 24. The source electrode 25 and the drain electrode 26 are disposed on the second insulation layer 29 and covered by the interlayer insulation layer 71. Both of the source electrode 25 and the drain electrode 26 pass through the second insulation layer 29 and overlap with two sides of the active layer 23, respectively. Moreover, the drain electrode 26 further passes through the second insulation layer 29 and the first insulation layer 28 and is lap-jointed with the light-shielding layer 22.

It should be noted that, in the display panel provided by the embodiments of the present disclosure, the thin film transistor layer 20 further includes the auxiliary cathode wiring 21, and the auxiliary cathode wiring 21 may be disposed in the same layer as the electrodes of the thin film transistor, such as the gate electrode 24, the source electrode 25, and/or the drain electrode 26. In some embodiments of the present disclosure, the auxiliary cathode wiring 21 being disposed in the same layer as the source electrode 25 and the drain electrode 26 that belongs to a second conductive layer is taken for an example for illustration.

Figure 4:
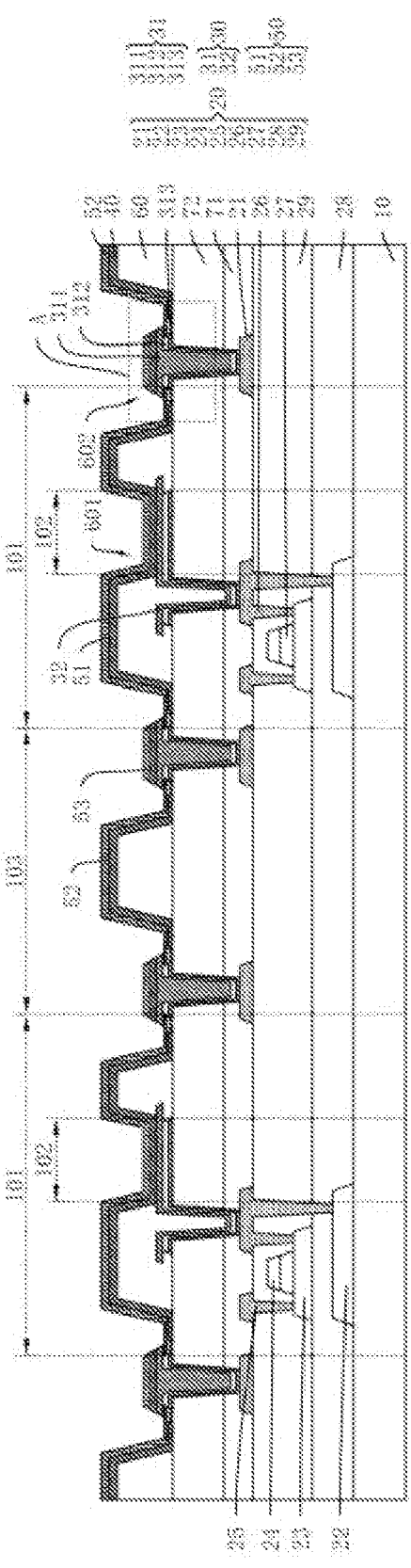
FIG. 4 is another schematic cross-sectional structural diagram of a display panel according to some embodiments of the present disclosure.

In an embodiment, the first conductive layer 30 includes the connection electrode 31 disposed on the planarization layer 72. In the embodiment of the present disclosure, the display panel includes at least two cathode unit areas 101 and a plurality of pixel areas 102. Each of the cathode unit areas 101 is provided with at least one pixel area 102, and the connection electrode 31 is disposed surrounding each of the cathode unit areas 101 and connected to the auxiliary cathode wiring 21. Moreover, the display panel further includes the spacing areas 103 disposed outside each of the cathode unit areas 101 and adjacent to corresponding cathode unit areas 101, as shown in FIG. 4, and all of the pixel areas 102 are disposed within the cathode unit area 101, rather than the spacing areas 103.

In an embodiment, the first conductive layer 30 further includes a plurality of anodes 32 that are disposed corresponding to the pixel areas 102 and connected to the corresponding drain electrode 26. It can be understood that a surrounding area of the connection electrode 31 may be defined as the cathode unit area 101. Specifically, it can be understood that, a side of the connection electrode 31 close to the cathode unit area 101 overlaps with the boundary of the cathode unit area 101, or a side of the connection electrode 31 close to the cathode unit area 101 is disposed within the cathode unit area 101. One anode 32 may correspond to one pixel area 102, and each of the anodes 32 is partially disposed within the corresponding pixel area 102 and extends outside the corresponding pixel area 102.

In the embodiment of the present disclosure, a first part of the connection electrode 31 close to the thin film transistor layer 20 passes through the planarization layer 72 and the interlayer insulation layer 71 and is connected to the auxiliary cathode wiring 21, and a side wall of a second part of the connection electrode 31 away from the thin film transistor layer 20 is in the concave shape to form the undercut opening 301. Similarly, a third part of the anode 32 close to the thin film transistor layer 20 passes through the planarization layer 72 and the interlayer insulation layer 71, and is connected to the drain electrode 26, and a side wall of a fourth part of the anode 32 away from the thin film transistor layer 20 is in the concave shape. In an embodiment provided by the present disclosure, the connection electrode 31 and the anode 32 are disposed in the same film layer and can be prepared in the same process, thus, the connection electrode 31 and the anode 32 may have the same sidewall morphology.

In an embodiment, the connection electrode 31 includes a first sub-layer 311 and a second sub-layer 312 disposed in stack, and the second sub-layer 312 is disposed between the first sub-layer 311 and the thin film transistor layer 20. A side wall of the second sub-layer 312 is in the concave shape relative to a side wall of the first sub-layer 311 to form the undercut opening 301. In the preparation process of the connection electrode 31, an etching rate for forming the second sub-layer 312 is greater than an etching rate for forming the first sub-layer 311.

Optionally, a material of the first sub-layer 311 may include aluminum, and a material of the second sub-layer 312 may include molybdenum.

In another embodiment, the connection electrode 31 may include the first sub-layer 311, the second sub-layer 312, and a third sub-layer 313 disposed in stack. The second sub-layer 312 is disposed between the first sub-layer 311 and the third sub-layer 313. The third sub-layer 313 is disposed between the second sub-layer 312 and the thin film transistor layer 20. The side wall of the second sub-layer 312 and a side wall of the third sub-layer 313 are in the concave shape relative to the side wall of the first sub-layer 311 to form the undercut opening 301. In the preparation process of the connection electrode 31, both of the etching rate for forming the second sub-layer 312 and an etching rate for forming the third sub-layer 313 are greater than the etching rate for forming the first sub-layer 311.

Optionally, both of the material of the first sub-layer 311 and a material of the third sub-layer 313 may include indium zinc oxide (IZO), and the material of the second sub-layer 312 may include silver. A thickness of the first sub-layer 311 is greater than a thickness of the third sub-layer 313, making the etching rate for forming the first sub-layer 311 less than the etching rate for forming the third sub-layer 313.

The pixel definition layer 60 is disposed on a side of the first conductive layer 30 away from the thin film transistor layer 20. The pixel definition layer 60 is provided with a first opening 601 disposed within the pixel area 102 and a second opening 602 corresponding to the connection electrode 31. The first opening 601 exposes at least a part of an upper surface of the anode 32, and the second opening 602 exposes at least a part of an upper surface of the connection electrode 31.

It should be noted that one connection electrode 31 may correspond to one second opening 602, and the connection electrode 31 may be totally disposed in the corresponding second opening 602. The second opening 602 is disposed surrounding the cathode unit area 101 and connected to the undercutting opening 301.

The light-emitting functional layer 40 is disposed on a side of the pixel definition layer 60 away from the thin film transistor layer 20. The light-emitting functional layer 40 is partitioned at the undercut opening 301 of the connection electrode 31, that is, the light-emitting functional layer 40 is partitioned by the connection electrode 31. The light-emitting functional layer 40 includes a light-emitting part disposed in the first opening 601 and on the anode 32, and the light-emitting part is disposed within the cathode unit area 101.

The cathode layer 50 is disposed on a side of the light-emitting functional layer 40 away from the thin film transistor layer 20 and partitioned at the undercut opening 301 of the connection electrode 31. The connection electrode 31 is disposed at least within the spacing areas 103. Specifically, a part of the connection electrode 31 may be disposed within the spacing areas 103, and another part of the connection electrode 31 may extend into the cathode unit area 101, thus, the undercutting opening 301 of the connection electrode 31 divides the cathode layer 50 into at least the first cathode 51 disposed within the cathode unit area 101 and the second cathode 52 disposed within the spacing areas 103, and the first cathode 51 and the second cathode 52 are separated by the connection electrode 31, so that the first cathode 51 and the second cathode 52 are spaced apart. The first cathode 51 covers the cathode unit area 101 and at least one pixel area 102 disposed within the cathode unit area 101, and the second cathode 52 is disposed within the spacing areas 103 and does not cover the pixel area 102.

In the embodiments of the present disclosure, the second opening 602 exposes at least a side of the connection electrode 31 close to the first cathode 51, and the undercutting opening 301 is disposed at least on a side of the connection electrode 31 close to the first cathode 51, so that the undercutting opening 301 is communicated with the second opening 602, and the first cathode 51 extends into the second opening 602 and the undercutting opening 301 and is connected to the connection electrode 31.

It should be noted that, the cathode layer 50 further includes a third cathode 53 disposed on a side of the connection electrode 31 away from the thin film transistor layer 20, and the undercutting opening 301 includes a first undercutting opening 3011 disposed on a side of the connection electrode 31 close to the first cathode 51 and a second undercutting opening 3012 disposed on a side of the connection electrode 31 away from the first cathode 51. The first cathode 51 and the third cathode 53 are partitioned at the first undercutting opening 3011, and the second cathode 52 and the third cathode 53 are partitioned at the second undercut opening 3012, that is, the third cathode 53 is disposed between the first cathode 51 and the second cathode 52.

It can be understood that, by disposing the first cathode 51 being partitioned by the connection electrode 31 and connected to the auxiliary cathode wiring 21 through the connection electrode 31, the embodiment of the present disclosure divides the cathode layer 50 with a large area into a plurality of first cathodes 51 with a small area, thereby improving the voltage drop phenomenon of the cathode layer 50. Moreover, the embodiment of the present disclosure can independently control the voltage loaded on the corresponding first cathode 51 through the auxiliary cathode wiring 21, so that the first cathode 51 has a suitable voltage according to actual demands, which further improves the display uniformity of the display panel.

Further, the thin film transistor layer 20 includes a plurality of auxiliary cathode wirings 21 connected to a plurality of connection electrodes 31. Electric signals transmitted in the auxiliary cathode wirings 21 may be the same or different, and can be selected according to actual demands.

Specifically, the display panel includes a plurality of pixel areas 102 arranged along a first direction X and a second direction Y. The first direction X intersects with the second direction Y. The plurality of auxiliary cathode wirings 21 are arranged along the first direction X, and each of the auxiliary cathode wirings 21 extends along the second direction Y. Moreover, the thin film transistor layer 20 further includes a plurality of data lines arranged along the first direction X and extending along the second direction Y. The auxiliary cathode wirings 21 may be disposed parallel to the data lines, and at least one auxiliary cathode wiring 21 is disposed between adjacent data lines.

In an embodiment, the first direction X and the second direction Y are perpendicular.

In an embodiment, the display panel includes a display area and a non-display area, and the cathode unit area 101, the spacing areas 103, and the pixel areas 102 are disposed within the display area. The display panel further includes a plurality of signal terminals disposed within the non-display area, and the plurality of signal terminals may be connected to the plurality of auxiliary cathode wirings 21 in a one-to-one correspondence form, so as to realize the independent control to the transmission signal of each of the auxiliary cathode wirings 21.

In an embodiment, the auxiliary cathode wirings 21, the source electrode 25, the drain electrode 26, and the data lines can be prepared from the same layer, which belongs to the second conductive layer, and thus, the preparation of the auxiliary cathode wirings 21 can be completed without the addition of a mask.

In an embodiment, each connection electrode 31 may be connected to two auxiliary cathode wirings 21, and two auxiliary cathode wirings 21 are connected to two opposite sides of the connection electrode 31 along the first direction X, so that the voltage can be loaded on the first cathode 51 surrounded by the connection electrode 31, even simultaneously loaded on two sides of the first cathode 51, which improves uniformity of the piezoelectric loading on the first cathode 51 and the improvement effect of the voltage drop of the cathode layer 50.

In an embodiment, the display panel includes a plurality of pixel areas 102, a plurality of cathode unit areas 101, and a plurality of connection electrodes 31. Each of the cathode unit areas 101 includes one pixel area 102, and one connection electrode 31 is disposed surrounding one cathode unit area 101, so as to separate the plurality of first cathodes 51 from the cathode layer 50. Moreover, each of the first cathodes 51 correspondingly cover one pixel area 102 and the light-emitting part within the corresponding pixel area 102, thus, each of the auxiliary cathode wirings 21 can independently control the voltage loaded on each of the first cathodes 51 to improve the display uniformity of the display panel, as shown in FIG. 1 and FIG. 3.

Figure 5:
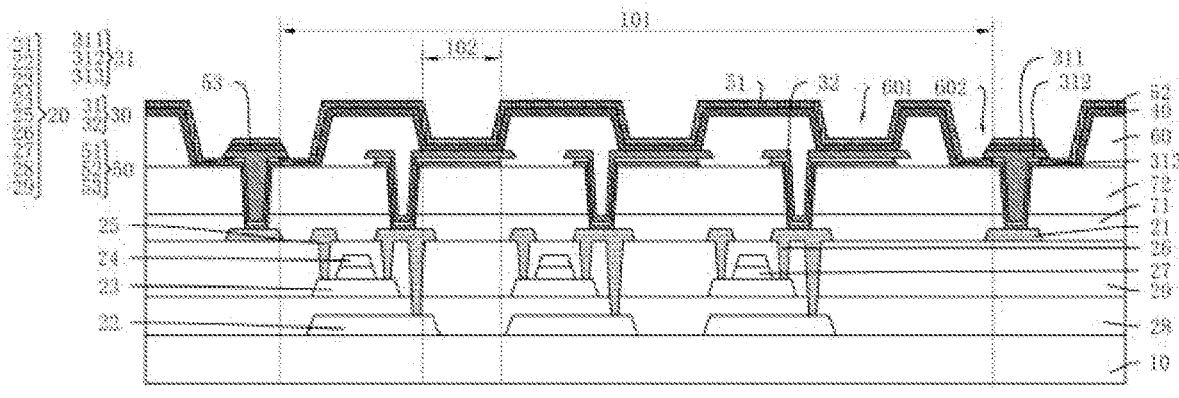
FIG. 5 is another schematic cross-sectional structural diagram of a display panel according to some embodiments of the present disclosure.
Figure 6:
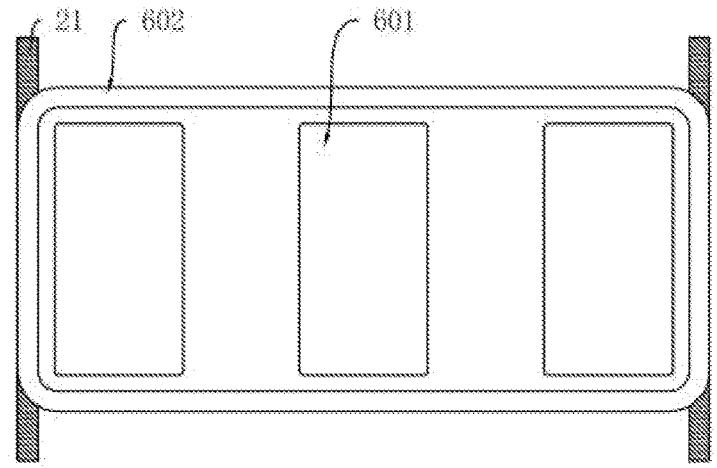
FIG. 6 is another schematic planar structural diagram of a display panel according to some embodiments of the present disclosure.

Referring to FIG. 5 and FIG. 6, another embodiment is different from the above-mentioned embodiment in that each of the cathode unit areas 101 includes three pixel areas 102, and one connection electrode 31 is disposed surrounding one cathode unit area 101, so as to separate the plurality of first cathodes 51 from the cathode layer 50. Moreover, each of the first cathodes 51 correspondingly covers three pixel areas 102 and the light-emitting part within the corresponding pixel area 102, thus, the auxiliary cathode wiring 21 can independently control the voltage loaded on each of the first cathodes 51 to improve the display uniformity of the display panel.

It should be noted that, in the embodiments shown in FIG. 1 and FIG. 5, the second cathode 52 is disposed between adjacent cathode unit areas 101, and the first cathode 51 and the second cathode 52 are spaced apart. Due to the electrical connection relationship between the first cathode 51 and the second cathode 52 through the connection electrode 31, when it is necessary to control the preset voltage loaded on the corresponding first cathode 51 disposed within a preset cathode unit area of the display panel, the first cathode 51 disposed within the cathode unit area 101 and adjacent to the preset cathode unit area would be affected by the preset voltage due to the conduction effect of the second cathode 52. On the one hand, the preset voltage loaded on the first cathode 51 disposed within the preset cathode unit area is transmitted through the auxiliary cathode wiring 21; on another hand, the voltage loaded on the first cathode 51 disposed within the adjacent cathode unit areas 101 is affected by the preset voltage and then transmitted through the second cathode 52 in a planar distribution. Since the resistance of the auxiliary cathode wiring 21 is much smaller than the resistance of the second cathode 52, the influence of the preset voltage on the first cathode 51 disposed within adjacent cathode unit areas 101 is less. Further, in a direction away from the preset cathode unit area, the influence of the preset voltage on other cathode unit areas 101 gradually decreases, thus achieving the independent control of the voltage loaded on the first cathode 51 disposed within the preset cathode unit area.

In the embodiments shown in FIG. 1 and FIG. 5, since it is not necessary to choose and control the position of the undercut opening 301 in the connection electrode 31 (that is, both of a side of the connection electrode 31 close to the first cathode 51 and a side of the connection electrode 31 away from the first cathode 51 are provided with the undercut opening 301), the connection electrode 31 can be exposed in the second opening 602. Thus, it is not necessary for the pixel definition layer 60 to cover the side wall of the connection electrode 31 that does not require etching in the manufacturing process, which reduces the accuracy required for the manufacturing process, makes the width of the connection electrode 31 smaller, and saves wiring space of the first conductive layer 30.

Figure 7:
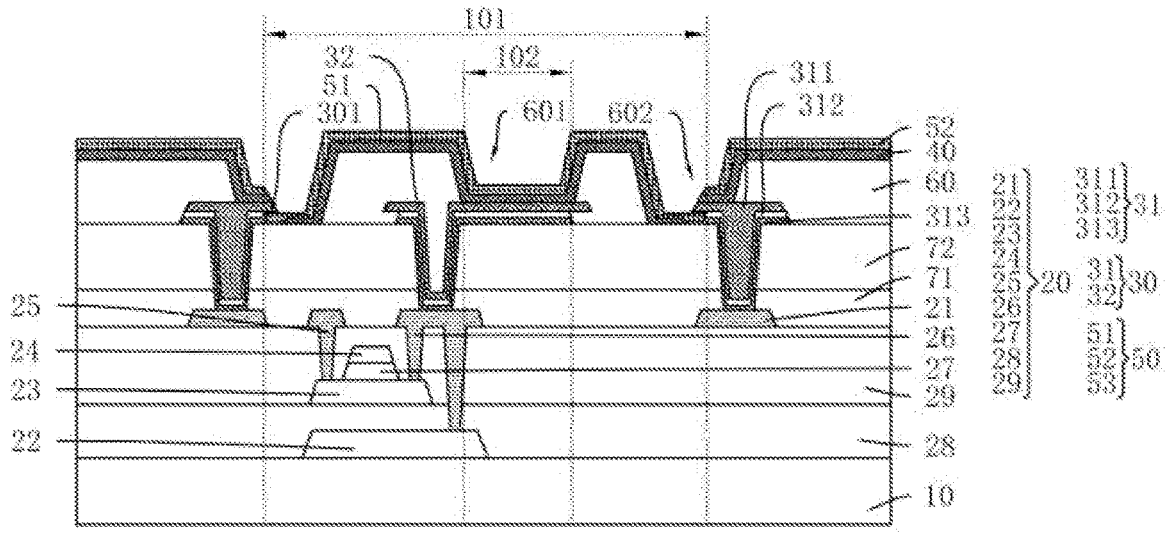
FIG. 7 is another schematic cross-sectional structural diagram of a display panel according to some embodiments of the present disclosure.

Referring to FIG. 7, another embodiment of the present disclosure is different from the embodiment shown in FIG. 1 in that the connection electrode 31 is partially disposed in the second opening 602, that is, an orthographic projection of the connection electrode 31 on the thin film transistor layer 20 partially overlaps with an orthographic projection of the second opening 602 on the thin film transistor layer 20, the undercut opening 301 is disposed on a side of the connection electrode 31 close to the first cathode 51 and communicated with the second opening 602, and the first cathode 51 extends into the undercutting opening 301 and is connected to the connection electrode 31.

In this embodiment, the first cathode 51 and the second cathode 52 are spaced apart, and the first cathode 51 and the second cathode 52 are insulated, so that the first cathodes 51 in adjacent cathode unit areas 101 are insulated to realize the independent loading of voltage on the first cathodes 51 in each of the cathode unit areas 101.

In view of the foregoing, embodiments of the present disclosure, by disposing the connection electrode 31 and the cathode unit area 101, separate the first cathode 51 from the cathode layer 50, realize the signal transmission of the auxiliary cathode wiring 21 to the first cathode 51, effectively improve the voltage drop phenomenon of the cathode layer 50, and improve the display uniformity of the display panel. Moreover, by disposing the connection electrode 31 surrounding the first cathode 51, and separating the first cathode 51 from other parts of the cathode layer 50, the embodiments of the present disclosure realize the function of independent signal transmission of the auxiliary cathode wiring 21 to the first cathode 51, so that suitable voltage can be loaded on the first cathode 51 according to actual demands, which further improves the display uniformity of the display panel.

Moreover, embodiments of the present disclosure further provide a preparation method of the display panel as described in any of the above-mentioned embodiments. Referring to FIGS. 1 to 3 and FIGS. 8 to 12, the display panel includes the cathode unit area 101, and the spacing areas 103 disposed outside the cathode unit area 101 and adjacent to the cathode unit area 101, and the cathode unit area 101 includes at least one pixel area 102. The preparation method of the display panel includes the following steps.

The substrate 1 is provided, and the substrate 1 may be a glass substrate.

The substrate 10 is cleaned, then a first metal material layer is deposited on the substrate 10 and patterned to obtain the light-shielding layer 22. A material of the first metal material layer may include at least one of Mo, Ti, Cu, and Mn.

The first insulation layer 28 covering the light-shielding layer 22 is formed on the substrate 10. A material of the first insulation layer 28 may include at least one of silicon nitride and silicon oxide.

A semiconductor material layer is formed on the first insulation layer 28 and patterned to obtain the active layer 23 that is disposed on a side of the light-shielding layer 22 away from the substrate 10. A material of the semiconductor material layer may include indium gallium zinc oxide (IGZO), indium zinc tin oxide (IZTO), and indium gallium zinc tin oxide (IGZTO).

An insulation material layer and a second metal material layer are formed on the active layer 23, and the second metal material layer is patterned to obtain the gate electrode 24. Then, the gate electrode 24 is taken as a mask to pattern the insulation material layer, so as to form the gate insulation layer 27 that is disposed between the gate electrode 24 and the active layer 23. A material of the insulation material layer may include at least one of silicon nitride and silicon oxide, and a material of the second metal material layer may include at least one of Mo, Ti, and Cu.

Plasma treatment is performed on the display panel to realize the conductive treatment of a part of the active layer 23 that is not covered by the gate electrode 24, and a part of the active layer 23 that is covered by the gate electrode 24 maintains the semiconductor characteristic to form a channel.

The second insulation layer 29 covering the active layer 23, the gate insulation layer 27, and the gate electrode 24 is formed on the gate electrode 24. A material of the second insulation layer 29 includes at least one of silicon nitride and silicon oxide.

The second insulation layer 29 and the first insulation layer 28 are patterned to form a part of an upper surface of the active layer 23 that exposes two sides of the active layer 23 and has undergone the conductive treatment, and exposes a part of an upper surface of the light-shielding layer 22.

Figure 8:
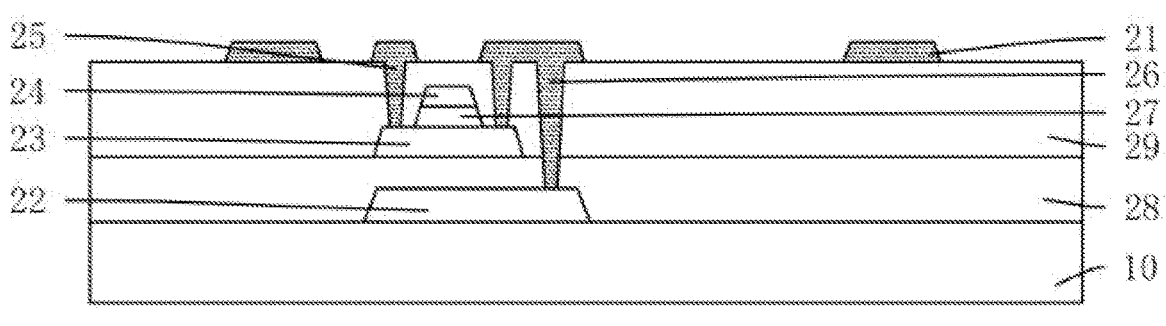
FIGS. 8 to 12 are schematic structural diagrams of a display panel in a preparation process according to some embodiments of the present disclosure.

A third metal material layer is deposited on the second insulation layer 29 and patterned to form the auxiliary cathode wiring 21, the source electrode 25, and the drain electrode 26 that are disposed on the second insulation layer 29. The source electrode 25 and the drain electrode 26 respectively pass through the second insulation layer 29 and are lap-jointed with two sides of the active layer 23 that have undergone the conductive treatment. The drain electrode 26 further passes through the second insulation layer 29 and the first insulation layer 28 and is lap-jointed with the light-shielding layer 22, as shown in FIG. 8.

The interlayer insulation layer 71 and the planarization layer 72 are formed on the second insulation layer 29 that covers the auxiliary cathode wiring 21, the source electrode 25, and the drain electrode 26. A material of the interlayer insulation layer 71 may include at least one of silicon nitride and silicon oxide.

Figure 9:
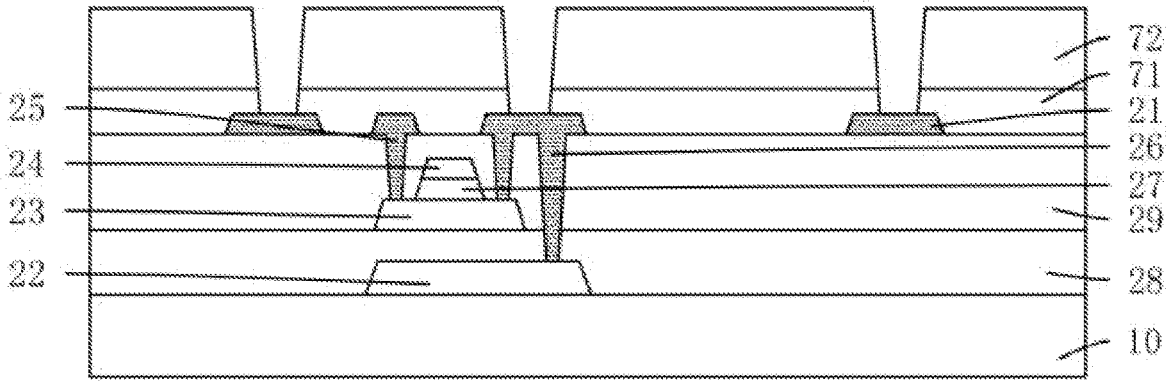

The planarization layer 72 and the interlayer insulation layer 71 are patterned to form via holes that expose the auxiliary cathode wiring 21 and the drain electrode 26, as shown in FIG. 9.

A first conductive material layer is formed on the planarization layer 72 and patterned to form the first conductive layer 30. The first conductive layer 30 includes the connection electrode 31 and the anode 32. The connection electrode 31 passes through the planarization layer 72 and the interlayer insulation layer 71 and is lap-jointed with the auxiliary cathode wiring 21. The anode 32 passes through the planarization layer 72 and the interlayer insulation layer 71 and is lap-jointed with the drain electrode 26. The connection electrode 31 is further disposed surrounding the cathode unit area 101.

Figure 10:
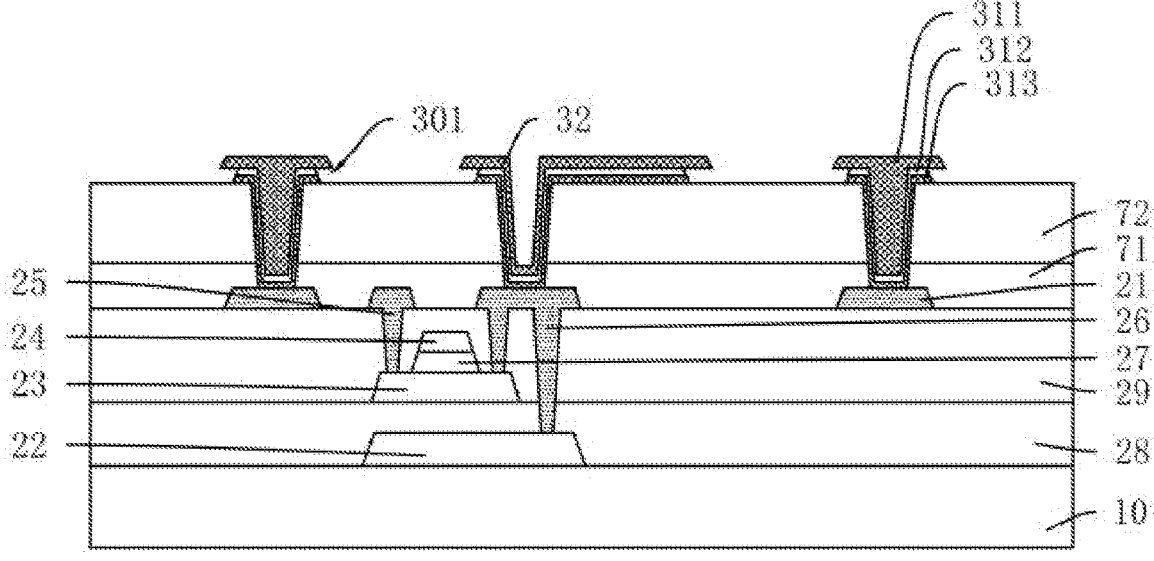

It should be noted that during the patterning process of the first conductive material layer, because the connection electrode 31 includes the first sub-layer 311, the second sub-layer 312, and the third sub-layer 313 disposed in stack, the second sub-layer 312 is disposed between the first sub-layer 311 and the third sub-layer 313, the third sub-layer 313 is disposed between the second sub-layer 312 and the thin film transistor layer 20, and both of the etching rate for forming the second sub-layer 312 and the etching rate for forming the third sub-layer 313 are greater than the etching rate for forming the first sub-layer 311, the side walls of the second sub-layer 312 and the third sub-layer 313 are in the concave shape relative to the side wall of the first sub-layer 311, so as to form the undercut opening 301 at the side wall of the connection electrode 31, as shown in FIG. 10.

Figure 11:
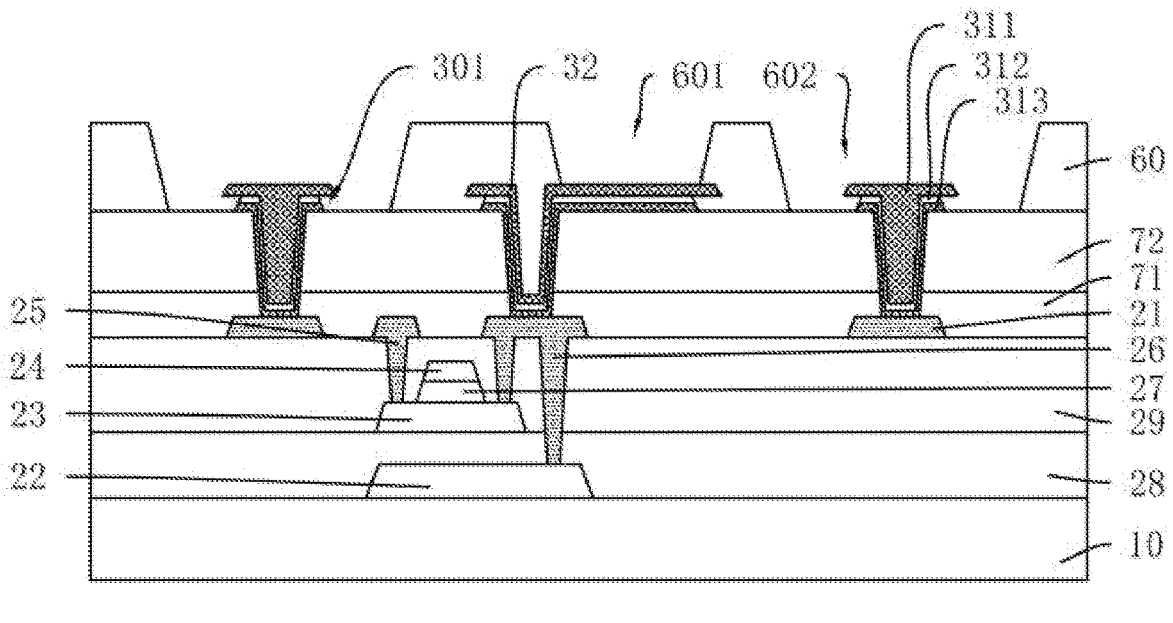

The pixel definition layer 60 is formed on the first conductive layer 30 and patterned to form a plurality of first openings 601 and a plurality of first openings 602 in the pixel definition layer 60. Each of the first openings 601 is disposed within the pixel area 102 and exposes a part of the upper surface of the anode 32, each of the second openings 602 exposes the connection electrode 31, and the undercut opening 301 is communicated with the corresponding second opening 602, as shown in FIG. 11.

Figure 12:
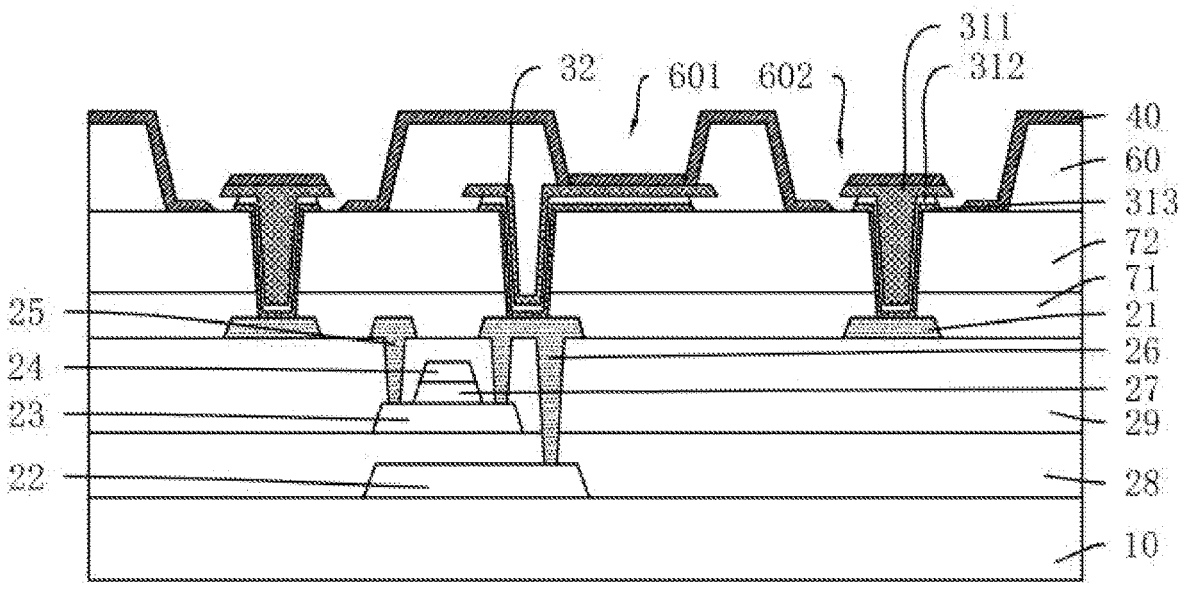

The light-emitting functional layer 40 is formed on the pixel definition layer 60. The light-emitting functional layer 40 covers the plurality of first openings 601 in the pixel definition layer 60 and is partitioned at the undercut opening 301 of the connection electrode 31, as shown in FIG. 12.

The cathode layer 50 is formed on the light-emitting functional layer 40. The cathode layer 50 is partitioned at the undercut opening 301 of the connection the electrode 31, as shown in FIG. 1.

It should be noted that, in the embodiments of the present disclosure, the connection electrode 31 is disposed in a circular shape and surrounding the cathode unit area 101, the cathode layer 50 is divided by the connection electrode 31 into the first cathode 51 disposed within the cathode unit area 101 and the second cathode 52 spaced with the first cathode 51, the connection electrode 31 is disposed surrounding the first cathode 51 and connected to the auxiliary cathode wiring 21, and the first cathode 51 covers the light-emitting functional layer 40 within the cathode unit area 101, thus, the voltage loaded on the first cathode 51 can be independently controlled to improve the uneven display of the display panel.

Based on the above, the embodiments of the present disclosure, by dividing the cathode unit area 101 that includes at least one pixel area 102 from the display panel, separate the first cathode 51 from the cathode layer 50, realize the signal transmission of the auxiliary cathode wiring 21 to the first cathode 51, effectively improve the voltage drop phenomenon of the cathode layer 50, and improve the display uniformity of the display panel. Moreover, by disposing the connection electrode 31 surrounding the first cathode 51, and separating the first cathode 51 from other parts of the cathode layer 50, the embodiments of the present disclosure realize the function of independent signal transmission of the auxiliary cathode wiring 21 to the first cathode 51, so that suitable voltage can be loaded on the first cathode 51 according to actual demands, which further improves the display uniformity of the display panel.

Moreover, the embodiments of the present disclosure further provide a display apparatus, which includes the display panel as described in any one of the above-mentioned embodiments, and the structure of the display panel can be the same as that in the above-mentioned embodiments, and will not be repeated here.

In some embodiments, the display apparatus may include a display device, such as a mobile phone, a television, a computer, a tablet, a watch, or the like.

In the above-mentioned embodiments, the description of each embodiment has its own emphasis. For the parts that are not detailed in one embodiment, please refer to the relevant descriptions of other embodiments.

The display panel and the display apparatus provided by the embodiments of the present disclosure are described in detail. In this context, specific embodiments are adopted to illustrate a principle and implementation modes of the present disclosure. The description of the above-mentioned embodiments is only used to help understand methods and a core idea of the present disclosure. At the same time, for those skilled in the art, according to the idea of the present disclosure, there might be changes in specific implementation modes and a scope of the present disclosure, which falls within the scope of the protection of the present disclosure. In conclusion, contents of the specification should not be interpreted as a limitation of the present disclosure.

What is claimed is:

1. A display panel comprising a plurality of cathode unit areas, a spacing area disposed outside the plurality of cathode unit areas and adjacent to the plurality of cathode unit areas, wherein each of the plurality of cathode unit areas is provided with at least one pixel area;

wherein the display panel further comprises:

a thin film transistor layer comprising an auxiliary cathode wiring;

a first conductive layer disposed on the thin film transistor layer, wherein the first conductive layer comprises a plurality of connection electrodes disposed surrounding the plurality of cathode unit areas, and one of the plurality of connection electrodes is connected to the auxiliary cathode wiring, and a side wall of the one of the plurality of connection electrodes is in a concave shape to form an undercut opening disposed surrounding one of the plurality of cathode unit areas;

a light-emitting functional layer disposed on a side of the first conductive layer away from the thin film transistor layer and partitioned at the undercut opening; and a cathode layer disposed on a side of the light-emitting functional layer away from the thin film transistor layer and partitioned at the undercut opening;

wherein the cathode layer comprises a plurality of first cathodes disposed within the plurality of cathode unit areas and a second cathode disposed within the spacing area, the second cathode is disposed between two adjacent ones of the plurality of cathode unit areas, and the one of the plurality of connection electrodes is disposed surrounding one of the plurality of first cathodes and connected to the one of the plurality of first cathodes.

2. The display panel of claim 1, wherein the display panel further comprises a pixel definition layer disposed between the first conductive layer and the light-emitting functional layer, and the pixel definition layer comprises a first opening disposed within the pixel area and a second opening disposed corresponding to the one of the plurality of connection electrodes; and wherein the light-emitting functional layer comprises a light-emitting part disposed in the first opening, at least a part of the one of the plurality of connection electrodes is disposed in the second opening, and the undercut opening is communicated with the second opening; the one of the plurality of first cathodes covers the light-emitting part within one of the plurality of cathode unit areas, extends into the second opening, and is connected to the one of the plurality of connection electrodes.

3. The display panel of claim 2, wherein the one of the plurality of connection electrodes is disposed at least within the spacing area, and the second cathode and the plurality of first cathodes are spaced apart.

4. The display panel of claim 3, wherein an orthographic projection of the one of the plurality of connection electrodes on the thin film transistor layer is disposed within an orthographic projection of the second opening on the thin film transistor layer, and the undercut opening comprises a first undercut opening disposed on a side of the one of the plurality of connection electrodes close to the one of the plurality of first cathodes and a second undercut opening disposed on a side away from the one of the plurality of first cathodes; the cathode layer further comprises a third cathode disposed on a side of the one of the plurality of connection electrodes away from the thin film transistor layer and at least within the spacing area; and wherein the one of the plurality of first cathodes and the third cathode are spaced apart at the first undercut opening, and the second cathode and the third cathode are spaced apart at the second undercut opening.

5. The display panel of claim 3, wherein an orthographic projection of the one of the plurality of connection electrodes on the thin film transistor layer partially overlaps with an orthographic projection of the second opening on the thin film transistor layer; the undercut opening is disposed on a side of the one of the plurality of connection electrodes close to the one of the plurality of first cathodes, and the one of the plurality of first cathodes and the second cathode are spaced at the undercut opening.

6. The display panel of claim 2, wherein the first conductive layer further comprises an anode disposed within the pixel area, and the light-emitting part is disposed in the first opening and on a side of the anode away from the thin film transistor layer.

7. The display panel of claim 1, wherein the plurality of cathode unit areas are arranged along a first direction and a second direction, and the first direction intersects with the second direction; the thin film transistor layer comprises a plurality of auxiliary cathode wirings extending along the second direction, and two opposite sides of each of the plurality of connection electrodes along the first direction are connected to two auxiliary cathode wirings, respectively.

8. The display panel of claim 7, wherein electric signals transmitted in the plurality of auxiliary cathode wirings are same or different.

9. The display panel of claim 7, wherein the thin film transistor layer further comprises a second conductive layer, and the second conductive layer comprises the auxiliary cathode wirings and a plurality of data lines extending along the second direction.

10. The display panel of claim 1, wherein the one of the plurality of connection electrodes comprises a first sub-layer and a second sub-layer disposed in stack, the second sub-layer is disposed between the first sub-layer and the thin film transistor layer, and a side wall of the second sub-layer is in a concave shape relative to a side wall of the first sub-layer to form the undercut opening at a side wall of the one of the plurality of connection electrodes.

11. The display panel of claim 1, wherein the one of the plurality of connection electrodes comprises a first sub-layer, a second sub-layer, and a third sub-layer disposed in stack, wherein the second sub-layer is disposed between the first sub-layer and the third sub-layer, the third sub-layer is disposed between the second sub-layer and the thin film transistor layer, and both of a side wall of the second sub-layer and a side wall of the third sub-layer are in a concave shape relative to a side wall of the first sub-layer to form the undercut opening.

12. The display panel of claim 1, wherein the first conductive layer further comprises an anode disposed within the pixel area, and the light-emitting part is disposed within the first opening and on a side of the anode away from the thin film transistor layer; and wherein the one of the plurality of connection electrodes and the anode are arranged in a same layer, and a side wall of the anode is provided with another undercut opening having a same structure as the undercut opening of the one of the plurality of connection electrodes.

13. The display panel of claim 1, wherein each of the plurality of cathode unit areas comprises three pixel areas, each of the plurality of connection electrodes is disposed around one of the plurality of cathode unit areas, and each the plurality of first cathodes correspondingly covers the three pixel areas.

14. The display panel of claim 1, wherein an orthographic projection of the one of the plurality of connection electrodes on the thin film transistor layer partially overlaps with an orthographic projection of the second opening on the thin film transistor layer, the undercut opening is disposed on a side of the one of the plurality of connection electrodes close to the one of the plurality of first cathodes and communicated with the second opening, and the one of the plurality of first cathodes extends into the undercut opening and is connected to the one of the plurality of connection electrodes.

15. A display apparatus comprising a display panel, wherein the display panel comprises a plurality of cathode unit areas, a spacing area disposed outside the plurality of cathode unit areas and adjacent to the plurality of cathode unit areas, wherein each of the plurality of cathode unit areas is provided with at least one pixel area;

wherein the display panel further comprises:

a thin film transistor layer comprising an auxiliary cathode wiring;

a first conductive layer disposed on the thin film transistor layer, wherein the first conductive layer comprises a plurality of connection electrodes disposed surrounding the plurality of cathode unit areas, and one of the plurality of connection electrodes is connected to the auxiliary cathode wiring, and a side wall of the one of the plurality of connection electrodes is in a concave shape to form an undercut opening disposed surrounding one of the plurality of cathode unit areas;

a light-emitting functional layer disposed on a side of the first conductive layer away from the thin film transistor layer and partitioned at the undercut opening; and a cathode layer disposed on a side of the light-emitting functional layer away from the thin film transistor layer and partitioned at the undercut opening;

wherein the cathode layer comprises a plurality of first cathodes disposed within the plurality of cathode unit areas and a second cathode disposed within the spacing area, the second cathode is disposed between two adjacent ones of the plurality of cathode unit areas, and the one of the plurality of connection electrodes is disposed surrounding one of the plurality of first cathodes and connected to the one of the plurality of first cathodes.

16. The display apparatus of claim 15, wherein the display panel further comprises a pixel definition layer disposed between the first conductive layer and the light-emitting functional layer, and the pixel definition layer comprises a first opening disposed within the pixel area and a second opening disposed corresponding to the one of the plurality of connection electrodes; and wherein the light-emitting functional layer comprises a light-emitting part disposed in the first opening, at least a part of the one of the plurality of connection electrodes is disposed in the second opening, and the undercut opening is communicated with the second opening; the one of the plurality of first cathodes covers the light-emitting part within one of the plurality of cathode unit areas, extends into the second opening, and is connected to the one of the plurality of connection electrodes; the one of the plurality of connection electrodes is disposed at least within the spacing area, and the second cathode and the plurality of first cathodes are spaced apart.

17. The display apparatus of claim 16, wherein an orthographic projection of the one of the plurality of connection electrodes on the thin film transistor layer is disposed within an orthographic projection of the second opening on the thin film transistor layer, and the undercut opening comprises a first undercut opening disposed on a side of the one of the plurality of connection electrodes close to the one of the plurality of first cathodes and a second undercut opening disposed on a side away from the one of the plurality of first cathodes; the cathode layer further comprises a third cathode disposed on a side of the one of the plurality of connection electrodes away from the thin film transistor layer and at least within the spacing area; and wherein the one of the plurality of first cathodes and the third cathode are spaced apart at the first undercut opening, and the second cathode and the third cathode are spaced apart at the second undercut opening.

18. The display apparatus of claim 16, wherein an orthographic projection of the one of the plurality of connection electrodes on the thin film transistor layer partially overlaps with an orthographic projection of the second opening on the thin film transistor layer; the undercut opening is disposed on a side of the one of the plurality of connection electrodes close to the one of the plurality of first cathodes, and the one of the plurality of first cathodes and the second cathode are spaced at the undercut opening.

19. The display apparatus of claim 15, wherein the plurality of cathode unit areas are arranged along a first direction and a second direction, and the first direction intersects with the second direction; the thin film transistor layer comprises a plurality of auxiliary cathode wirings extending along the second direction, and two opposite sides of each of the plurality of connection electrodes along the first direction are connected to two auxiliary cathode wirings, respectively; and wherein the one of the plurality of connection electrodes comprises a first sub-layer and a second sub-layer disposed in stack, the second sub-layer is disposed between the first sub-layer and the thin film transistor layer, and a side wall of the second sub-layer is in a concave shape relative to a side wall of the first sub-layer to form the undercut opening at a side wall of the one of the plurality of connection electrodes.

20. A display panel comprising a cathode unit area, a spacing area disposed outside the cathode unit area and adjacent to the cathode unit area, wherein the cathode unit area is provided with at least one pixel area;

wherein the display panel further comprises:

a thin film transistor layer comprising an auxiliary cathode wiring;

a first conductive layer disposed on the thin film transistor layer, wherein the first conductive layer comprises a connection electrode disposed surrounding the cathode unit area and connected to the auxiliary cathode wiring, and a side wall of the connection electrode is in a concave shape to form an undercut opening disposed surrounding the cathode unit area;

a light-emitting functional layer disposed on a side of the first conductive layer away from the thin film transistor layer and partitioned at the undercut opening;

a pixel definition layer disposed between the first conductive layer and the light-emitting functional layer, wherein the pixel definition layer comprises a first opening disposed within the pixel area and a second opening disposed corresponding to the connection electrode; and a cathode layer disposed on a side of the light-emitting functional layer away from the thin film transistor layer and partitioned at the undercut opening;

wherein the cathode layer comprises a first cathode, a second cathode, and a third cathode; the first cathode is disposed within the cathode unit area, the connection electrode is disposed around the first cathode and is connected to the first cathode; the second cathode is disposed within the spacing area; the third cathode is disposed on a side of the connection electrode away from the thin film transistor layer and at least within the spacing area;

wherein the undercut opening comprises a first undercut opening disposed on a side of the connection electrode close to the first cathode and a second undercut opening disposed on a side away from the first cathode; and wherein the first cathode and the third cathode are spaced apart at the first undercut opening, and the second cathode and the third cathode are spaced apart at the second undercut opening.

* * * * *